Figure 1:
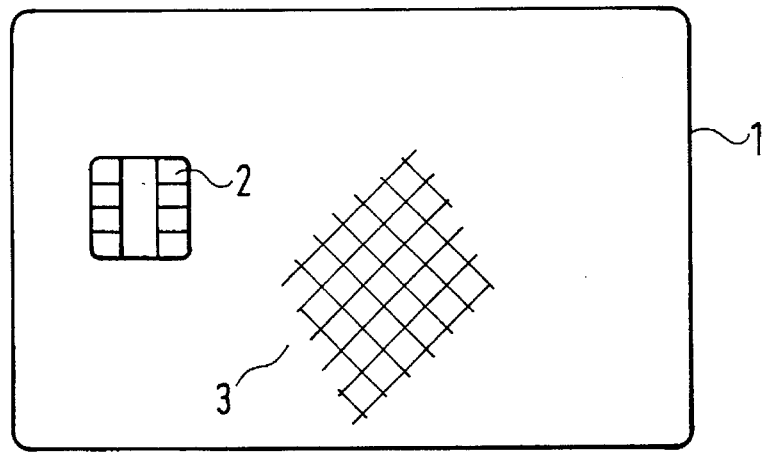

US005567362A

United States Patent [19]

Grün

[11] Patent Number: 5,567,362
[45] Date of Patent: Oct. 22, 1996

[54] IDENTITY CARD AND A METHOD AND APPARATUS FOR PRODUCING IT

[75] Inventor: Herbert Grün, Vaterstetten, Germany

[73] Assignee: GAO Gesellschaft fur Automation und Organisation mbH, Germany

[21] Appl. No.: 288,041

[22] Filed: Aug. 10, 1994

Related U.S. Application Data

[63] Continuation of Ser. No. 992,725, Dec. 18, 1992, abandoned.

[30] Foreign Application Priority Data

Dec. 20, 1991 [DE] Germany ............................ 41 42 408.5

[51] Int. Cl.⁶ .......................... B29C 45/16; B42D 15/10; G06K 19/18
[52] U.S. Cl. .................. 264/1.31; 264/255; 264/139; 264/273; 264/328.8; 264/245; 428/137; 428/916; 283/108; 283/904
[58] Field of Search ................................ 264/245, 255, 264/328.8, 294, 273, 1.31, 139; 428/67, 140, 138, 139, 137, 916, 141, 156, 142; 283/904, 107, 108, 109, 111

[56] References Cited

U.S. PATENT DOCUMENTS

| | | | |
|---|---|---|---|
| 2,226,408 | 12/1940 | Nast | 264/328.8 |
| 2,333,059 | 10/1943 | Tucker | 264/328.8 |
| 3,031,722 | 5/1962 | Gits | 264/255 |
| 3,363,039 | 1/1963 | Nagai et al. | 264/255 |
| 5,030,406 | 7/1991 | Sorensen | 264/255 |
| 5,045,268 | 9/1991 | Sorensen | 264/255 |

FOREIGN PATENT DOCUMENTS

| | | | |
|---|---|---|---|
| 62-80028 | 4/1987 | Japan | 264/1.31 |
| 62-233234 | 10/1987 | Japan | 264/1.31 |

*Primary Examiner*—Jill L. Heitbrink
*Attorney, Agent, or Firm*—Bacon & Thomas

[57] ABSTRACT

The invention relates to a flat molding produced by the injection molding technique, in particular an identity card, chip card or the like, characterized in that it has different volume areas containing different plastic components and formed and disposed so as to be distinguishable from one another visually and/or by measuring technology.

6 Claims, 3 Drawing Sheets

IDENTITY CARD AND A METHOD AND APPARATUS FOR PRODUCING IT

This application is a continuation of application Ser. No. 07/992,725, filed Dec. 18, 1992, now abandoned.

The present invention relates to a card produced by injection molding, in particular an identity card, chip card or the like, and to a method and apparatus for producing it.

In recent decades cards have become established in daily life in a great variety of areas. They are in use as identity cards, driver's licenses, access control cards, chip cards, credit cards, check guarantee cards and so on.

In the development of cards a trend has come about in the course of time according to which highest priority is given to their simple and inexpensive production. Cards have therefore passed from the original, extremely high-quality paper inlay card to the so-called all-plastic laminated card, and then to the injection molded card. Such cards are known for example from the publications, DE-C 23 08 876, EP-C 0 101 968, EP-C 0 197 847.

With paper inlay cards the antifalsification techniques known from paper-of-value manufacture were used to produce paper inlays that, embedded between transparent films, convey the esthetic impression of a paper of value while permitting visual and possibly also manual testing of the authenticity features customary in papers of value.

All-plastic laminated cards are, as their name says, constructed completely of plastic layers. The inlay in these cards can be equipped within certain limits with printed patterns equivalent to those in paper inlay cards, but it is either impossible or unreasonable for financial reasons to provide classical authenticity features suitable for human testing.

With injection molded cards, which can be produced extremely inexpensively like customary injection molded parts in injection molding machines, the quality of the printed pattern is again considerably reduced from today's point of view. Real advantages thus result only in the production of chip cards since the injection molding technique permits the card depressions required for embedding the chip modules to be produced in one operation during production of the card body, or even the chip module to be embedded in the card structure during the injection process.

In the further development of production techniques the possibility of human authenticity testing was thus increasingly abandoned in favor of cheaper production methods. With current injection molded cards, if they are chip cards, the electronic security can be increased to almost any degree by using ever more complicated integrated circuits, but the card structure as such is extremely simple and thus fairly unsuitable for strictly visual authenticity testing.

The problem of the invention is therefore to propose a card and a method and apparatus for producing it that take sufficient account not only of the aspect of inexpensive production in high piece numbers but also of the security aspect with respect to visual authenticity testing.

This problem is solved when the card structure has different volume areas containing different plastic components which are formed and disposed in such a way as to be distinguishable from one another visually and possibly also by machine.

The invention exploits the fact that at the current level of injection molding technology a great variety of both plastic components and foreign bodies can be processed in almost any desired arrangement and combination in multi-stage methods. If one utilizes these possibilities to produce a multicomponent card structure one can produce human features similar to those known from classical paper-of-value protection technology without neglecting the originally desired economizing effect.

It proves to be particularly advantageous that the invention goes on from classical card protection technology while utilizing up-to-date production techniques. Although the inventive card can have a great variety of visually testable card structures it can be readily integrated into common injection molding production methods. Along with the card properties provided for visual authenticity testing, further measures can be provided for facilitating the further processing of the cards or obtaining further production-related economizing effects.

Figure 2:
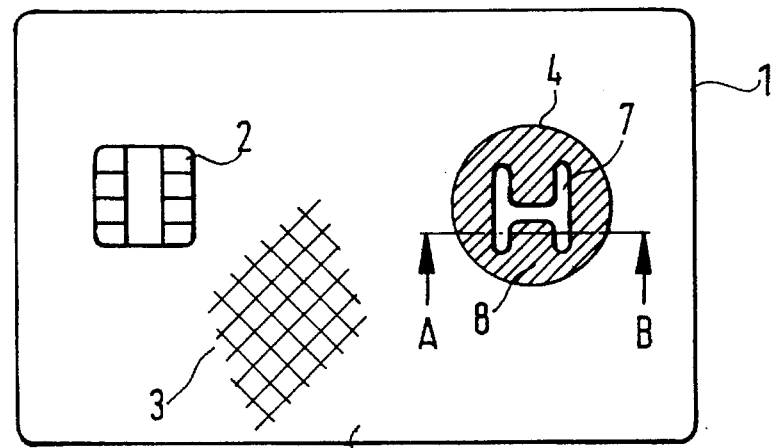
Figure 3:
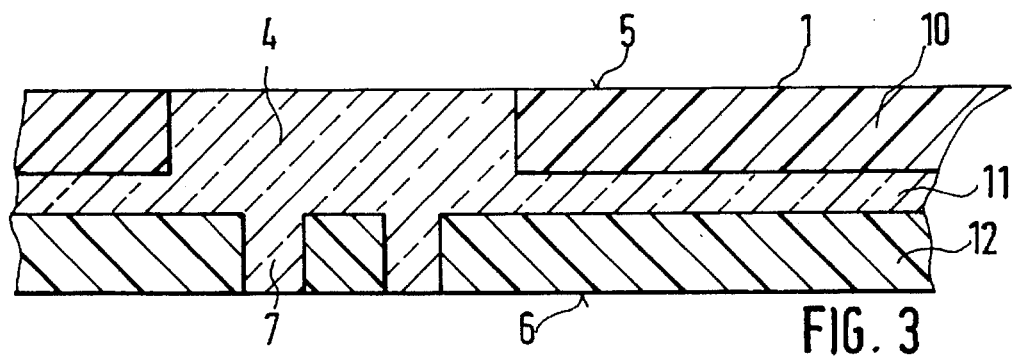
Figure 4A:
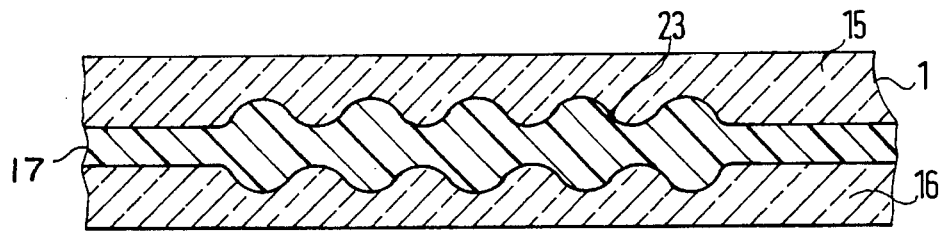
Figure 4B:
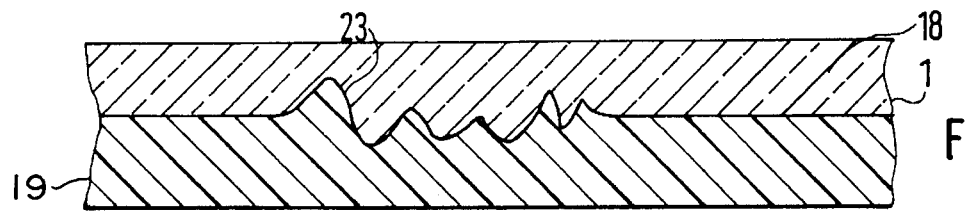
Figure 5:
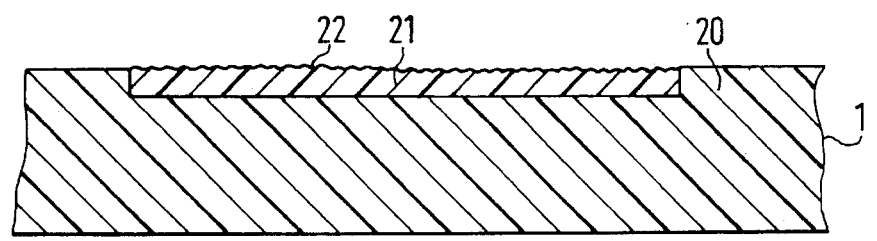
Figure 6:
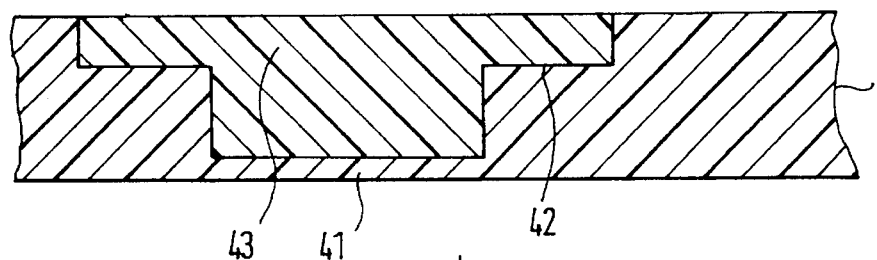
Figure 7:
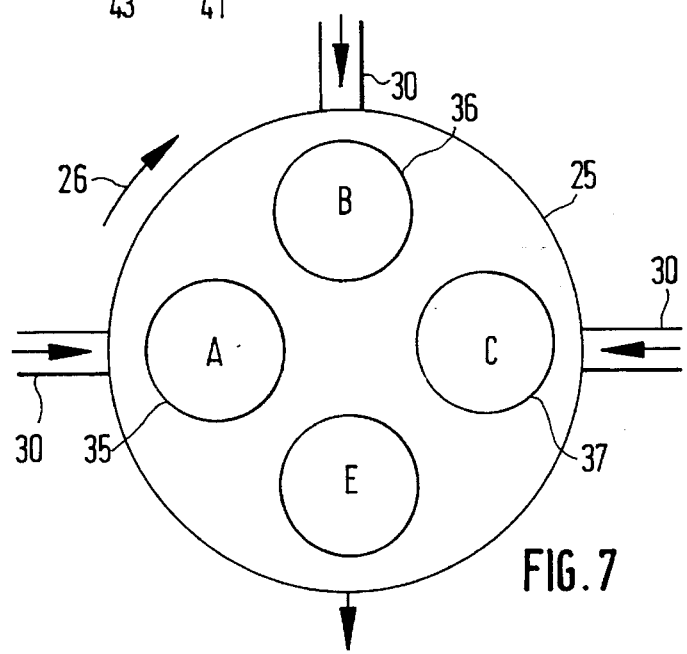
Figure 8A:
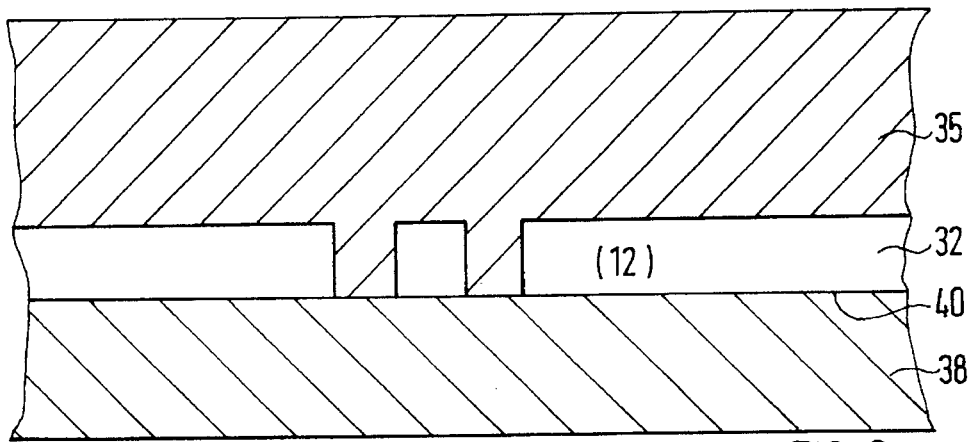
Figure 8B:
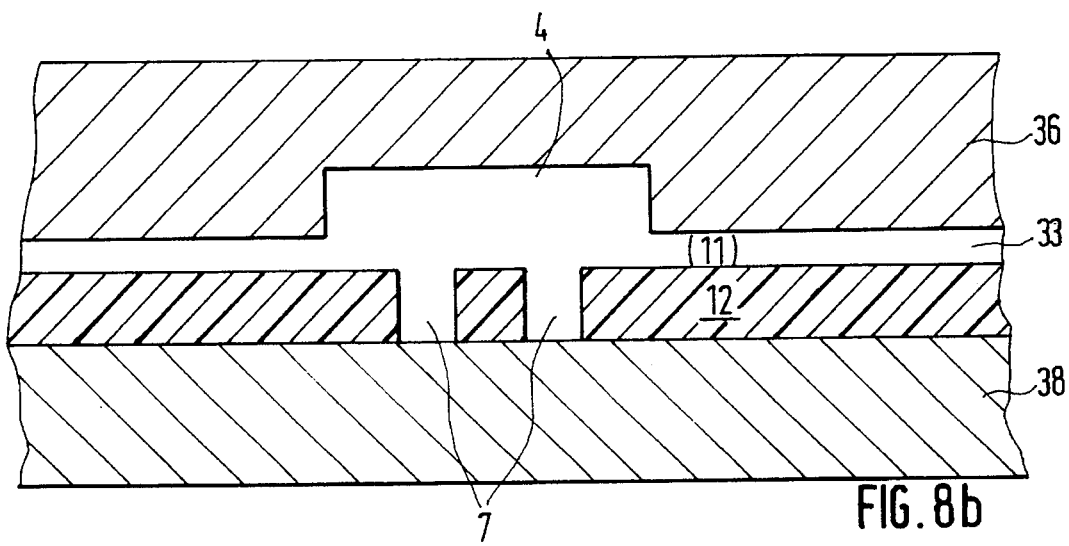
Figure 8C:
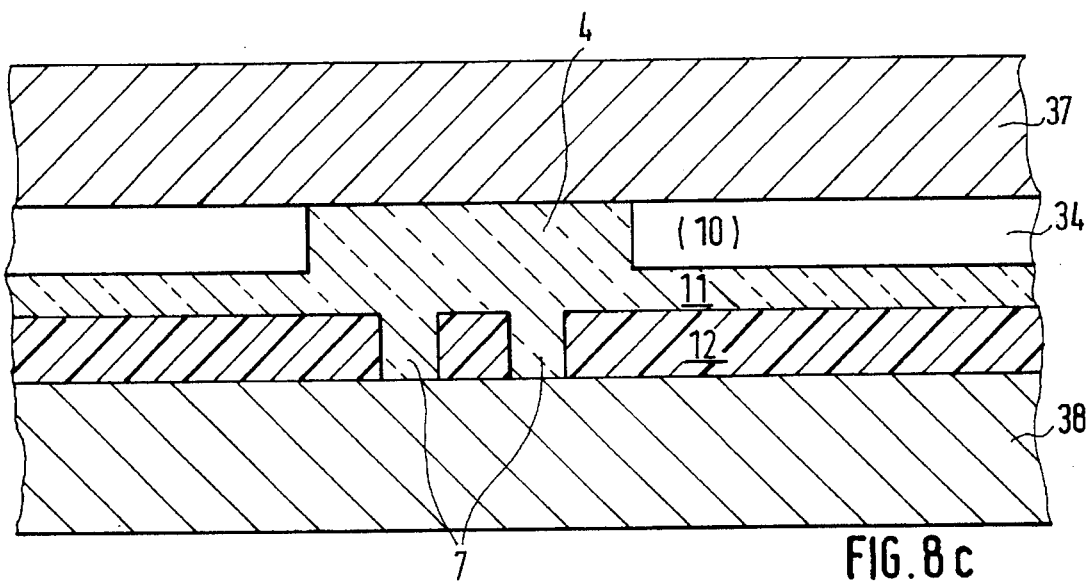

Developments of the invention and further advantages thereof can be found in the embodiment examples described with reference to the drawing, in which:

FIG. 1 shows a conventional chip card from the front,

FIG. 2 shows an inventive multicomponent injection molded card with a visually testable authenticity structure, FIGS. 3 to 5 show cross-sectional drawings of different variants of the inventive card structure, FIG. 6 shows a cross-sectional drawing of a structural element for economizing card production further, FIG. 7 shows a schematic diagram of an apparatus for producing inventive cards, FIGS. 8a to c show cross-sectional drawings for schematically illustrating the structure of the injection molding tools for producing the card structure shown in FIG. 3.

FIG. 1 shows a schematic representation of a conventional chip card 1 with an embedded chip module 2 and a printed pattern 3. Such cards are currently produced either by the classical laminating technique, i.e. by welding together several plastic layers and embedding the chip module during the laminating operation, or by producing a multi- or one-layer card body and milling in a depression in which the chip module can be inserted. The third and currently cheapest technique is to produce the card body by injection molding, either providing the depression for the chip module in the card body during the injection process or already embedding the chip module itself in the plastic compound during the injection process. Outside the area where the chip module is provided, currently known injection molded cards have no additional features produced by injection molding that permit visual or automatic authenticity testing.

FIG. 2 shows an inventive card body 1 in a simplified representation. This card body can have all the previous elements of customary injection molded cards, i.e. a chip module 2 or a printed pattern 3. But it furthermore contains at least one injection molding feature 4 that gives the card body a special character. This feature 4 is visually testable in a simple way and producible economically in large piece numbers but very difficult to imitate in single pieces (forgeries).

Injection molding feature 4, in the present case a letter "H" disposed in a circular area, is a representative example of a company logo, letter or pictorial symbol of any structure. In the present case card body 1 is provided on the front with a white card surface against which circular area 8 stands out.

FIG. 3 shows section A-B from FIG. 2. Card 1 is accordingly constructed of three layers, whereby layer 10 forming the front is white, back layer 12 is black and the middle layer is transparent. Front layer 10 and back layer 12 each have recesses that are likewise filled with the transparent plastic material of the middle layer. The recess on the front is of circular shape. It thus creates the contour of injection molding feature 4. The recesses in back cover layer 12 are in the form of pictorial symbol 7 so that symbol 7 is recognizable as a transparent "H" in black surroundings.

Such a feature 4 can be tested in three steps, namely in transmitted light from the front. In this test one sees a transparent symbol 7 extending throughout the card thickness and embedded in the deeper black background of the card. On the back, symbol 7 is disposed in the all-over black background. Regarding the side edges of the card one likewise readily sees the three-layer structure due to the strongly contrasting layers. Bending tests show whether the card structure and in particular the two card surfaces are of seamless and homogeneous design.

If the security of this card structure is to be further increased a hologram relief can be additionally provided in the surface of the back of the card during card production. This relief can be applied separately by the transfer method or be embossed during the injection process by providing such a relief in the injection mold.

Such a hologram relief placed on side 6 of the card is readily recognizable over the total surface, i.e. both in the black card area and in the area of symbol 7, when suitably illuminated from the back. Inhomogeneities resulting from the piecing together of various parts of the card (forgery) are particularly easy to detect in this embodiment. From the front of the card only pictorial symbol 7 has holographic effects when sufficiently illuminated in transmitted light.

If inner layer 11 is provided with fluorescent substances the fluorescent effect can likewise be included in the testing of the card.

It is also very easy to clarify the question of whether feature 4 is a homogeneously embedded element. One illuminates the card from the side edges, possibly using a specially provided apparatus, and regards pictorial symbol 4. Due to the guidance of light within inner layer 11 the pictorial symbol will "glow" in a very characteristic way. If feature 4 was inserted subsequently or put together from different layer elements this prevents the expected light-guiding effects, so that a genuine element 4 also differs from imitations very clearly in this test.

FIGS. 4a and 4b show a further variant of the inventive card structure. In FIG. 4a an opaque inner layer 17 is embedded between two transparent cover films 15 and 16. The opaque layer has a surface relief 23 on both sides that is recognizable as a relief from each side in incident light. Like an authentic watermark, the relief also appears darker in the thin areas than in the thick relief structures. In transmitted light a reversal of the optical effect can likewise be detected as with an authentic watermark, i.e. in this case the thick relief areas appear dark and the thinner structures light.

In terms of the optical effect the embodiment shown in FIG. 4b is very similar, i.e. here too a reversal of the light/dark structures can be detected depending on whether they are regarded in transmitted light or in incident light. However the effect is more powerful through transparent layer 18 than from back layer 19.

In special embodiments it may suffice to provide only one hologram on the card surface. In this case, as apparent from FIG. 5, the card area intended for the hologram (that may also extend over the entire card surface) is underlaid with a plastic compound with metallic luster or a very dark, preferably black, colored plastic material. The thickness of layer 21 is of lesser importance. It is only important for the invention that this layer is incorporated by injection molding and that the space of the injection mold adjacent this surface has a holographic relief which is embossed into black or metallescent surface 22.

Since the described layer structures and layer thicknesses can be produced relatively exactly these effects are very easy to detect by measuring technology if they are suitably dimensioned and designed. One thus not only has the possibility of visual testing but can also add special substances to the individual layers of the card structure and evaluate properties that are largely or completely concealed from visual testing. In this connection reference is made to magnetic effects, electrically conductive effects or luminescent effects in the invisible spectral range.

Departing from the embodiments described in FIGS. 3 to 5, whereby the inventive principle for producing special optical or measuring effects was described using compatible plastic materials, FIG. 6 shows an embodiment that uses incompatible plastic components for improving production operations.

FIG. 6 shows a section through the chip card area in which a chip module is later to be inserted. This area comprises card body 1 provided with a stepped depression 42. Bottom area 41 has a wall thickness of about 100 micrometers. After the card blank is completed this area is printed from both sides in separate method steps. A chip module similar to element 43 is then inserted.

When printing cards there was always the problem up to now that area 41 gave way to the pressure of the print roll so that errors in the printed pattern were produced in this area. Furthermore there is the danger of area 41 being damaged by mechanical action so that the card body becomes useless.

The inventive principle provides for injecting incompatible plastic materials into stepped depression 42 in one of the injection molding units. This fills the depression with insert element 43 so that area 41 can be readily printed in subsequent printing operations. When the various printing operations are over the card blank is for example bent over a curved surface to remove element 43. In this way it is easy to remove the insert element and replace it by a chip module.

The embodiment example described with reference to FIG. 6 is particularly useful for producing injection molded cards that are printed and then equipped with the chip modules in separate operations. This application is recommendable both for single cards and in cases in which multicopy sheets are to be produced by the injection molding technique.

FIG. 7 shows the schematic structure of a rotary table injection molding machine for producing e.g. a card in three separate injection operations (units A, B and C). The fourth unit E is provided for removing the card from the apparatus.

Referring to FIGS. 8a to c, the mode of functioning of the injection mold can be described as follows.

The injection mold basically comprises two rotary tables, the upper one being rigid and the lower one being rotatable in the direction of arrow 26. The upper rotary table is also vertically displaceable by means of apparatus elements not shown so as to permit a raising and lowering of this mold part. In the area of the four segments A to E the lower rotary table has depressions corresponding to the particular card shape. Depending on the embodiment the depth of these mold areas can be varied. In the present case it corresponds to the later card thickness.

In the mold parts of the upper rotary table the structures of mold parts 35, 36 and 37 are provided. These structures are adapted to the particular layer areas 12, 11 and 10 to be produced.

The different plastic components are injected into the mold via material feed means 30. After each injection operation the upper rotary table is raised and the lower rotary table turned further by one phase.

As apparent from FIG. 8a, layer 12 is injected in mold space 32 in the first unit (unit A). If a hologram relief is also to be produced on the back card surface, surface 40 must be equipped with such a relief. This can be done either by equipping the mold surface with the hologram relief or by inserting relief films that are replaced for each card or after a certain number of injection operations.

After the plastic material which is black in the described example has been injected in unit A the mold is cooled until the plastic compound solidifies. Upper mold part 35 is then raised and lower mold area 38 transported together with layer 12 to unit B. In unit B the mold part required for producing layer 11 is made available. Mold space 33 to be filled in unit B is positioned above layer 12 and in the present case filled with transparent plastic material. During this process both layer 11 extending over the entire card surface and the recesses provided in the area of the injection molding feature are filled with transparent material. After upper mold part 36 is raised and the lower rotary table rotated further the now two-layer card structure 12, 11 passes to unit C. Here the card structure is placed under mold part 37 for as yet lacking layer 10 to be injected in mold space 34.

After the card material is cooled and solidifies again the upper mold part is raised once again and the rotary table rotated further to pos. E for removal of the card.

It is obvious to the expert that the injection operations in units A, B and C take place at the same time, i.e. after two initial phases a finished card can be removed from unit E with each phase.

It is likewise obvious that one can use not only the card features explained with reference to FIGS. 3, 4 and 5 but also each feature per se or combinations of these features in one card. In addition one can emboss the depression for chip module 2 as well during the production of these cards. This can be done for example with the aid of a movable die to be pressed into the plastic compound while it is still ductile, Without departing from the inventive principle it is of course also possible to embed foreign bodies in the card structure as well. These may be for example safeguarding threads or prefabricated inlay areas introduced into the mold, or chip modules that are pressed into the plastic compound in the last working step or placed in a previously produced cavity.

Although the production of the inventive cards has been described with reference to a rotary table injection molding machine the expert will appreciate that this can also be done with other apparatus, for example apparatus in which the individual units A, B, C are disposed in a row and the lower mold parts are clocked past under the units using a kind of endless transport system.

For the cards described in FIGS. 3 to 5 compatible plastic components are used that have the corresponding optical and measuring properties and bond intimately with one another in the particular transitional area when "injected over one another." The expert will know which plastics have this property and will select them together with the particular optical and measuring properties. The same holds for incompatible plastic components that are required for producing removable insert elements 43 (FIG. 6).

I claim:

1. A method of injection molding a composite plastic identification card body comprising:

in succession, injecting a first plastic resin portion into an injection mold to delimit a first portion only of the card body, said first portion including a recess; permitting the first resin portion to solidify in the mold; then while the first resin portion is in the mold injecting into the mold at least a second plastic resin portion to delimit at least a portion of the remainder of the card body including filling said recess; then permitting the at least second resin portion to solidify in the mold; then removing the composite card body from the mold, wherein one of the plastic resin portions is incompatible with the other, and whereby one solidified resin portion may be separated from the other after the composite card body is removed from the mold to thereby leave a recess in the card body.

2. A method of injection molding a composite plastic identification card body comprising:

in succession, injecting a first plastic resin portion into an injection mold and solidifying said first resin portion to form at least a partial first layer of said card body; then while the first resin portion is in the mold injection into the mold a second plastic resin portion and solidifying said second resin portion to form at least a partial second layer of said card body; then injecting into the mold and solidifying a third plastic resin portion to form a third layer of said card body overlying said second layer; said second layer being molded so as to extend through said first and third layers to the respective outer surfaces of said first and third layers; and then removing the composite card body from the mold.

3. The method as claimed in claim 2, wherein said second layer is molded so that it extends through said first and third layers at the same location in the card body.

4. The method as claimed in claim 3, wherein said second resin portion is selected from plastic resins that are transparent when solidified and said first and third plastic resin portions are selected from plastic resins that are not transparent when solidified.

5. The method as claimed in claim 4, including selecting said first plastic resin portion so that it is opaque when solidified and colored black, and selecting said third plastic resin portion so that it is opaque when solidified and colored white.

6. A method of injection molding a composite plastic identification card body comprising:

in succession, injecting a first plastic resin portion into an injection mold to form a transparent first card layer; permitting the first resin portion to solidify in the mold; then while the first resin portion is in the mold injecting into the mold at least a second plastic resin portion to form an opaque second layer extending over said first layer; then permitting the at least second resin portion to solidify in the mold; and injecting and solidifying a third plastic resin portion using a resin that forms a third card layer that is transparent and overlies said second card layer; said second card layer being molded with varied thickness that is opaque to different degrees and thereby exhibits dark and light areas when observed in incident light, with the dark areas being reversed to light areas and the light areas being reversed to dark areas when observed in transmitted light; and then removing the composite card body from the mold.

* * * * *